(12) United States Patent
Saito

(10) Patent No.: US 8,044,341 B2
(45) Date of Patent: Oct. 25, 2011

(54) ELECTRONIC COMPONENT, ILLUMINATING DEVICE, CONTACT-TYPE IMAGE SENSOR, AND IMAGE READING DEVICE HAVING NO SHORT CIRCUIT CONDITION ACHIEVED BY ALLOWING ONLY ONE ELECTRODE OF AN LED CHIP IN DIRECT CONTACT WITH A METALLIC SUBSTRATE

(75) Inventor: Tomihisa Saito, Tokyo (JP)

(73) Assignee: Nippon Sheet Glass Co., Ltd., Tokyo (JP)

( * ) Notice: Subject to any disclaimer, the term of this patent is extended or adjusted under 35 U.S.C. 154(b) by 428 days.

(21) Appl. No.: 12/384,833

(22) Filed: Apr. 9, 2009

(65) Prior Publication Data

US 2009/0256064 A1 Oct. 15, 2009

(30) Foreign Application Priority Data

Apr. 15, 2008 (JP) ................................. 2008-105476

(51) Int. Cl.
*H01J 40/14* (2006.01)
(52) U.S. Cl. ...................................................... 250/239
(58) Field of Classification Search .................. 250/239, 250/214 R, 214.1, 208.1, 216; 257/80–84, 257/88, 98; 313/483, 498, 500; 438/122, 438/209, 26; 361/414, 410, 386–388
See application file for complete search history.

(56) References Cited

U.S. PATENT DOCUMENTS 6,156,980 A * 12/2000 Peugh et al. .................. 174/252

FOREIGN PATENT DOCUMENTS

JP 2005-217644 A 8/2005

* cited by examiner

*Primary Examiner* — Que T Le
(74) *Attorney, Agent, or Firm* — Carrier Blackman & Associates, P.C.; Joseph P. Carrier; William D. Blackman

(57) ABSTRACT

An electronic component capable of effectively dissipating heat generated in an LED chip and other elements is provided. A light emitting unit 1 includes a substrate 2 made of copper or aluminum, an insulating layer 3 formed on the surface thereof, a circuit pattern 4 formed on the insulating layer 3, and a circuit pattern 5 formed on the substrate 2 through an opening 3*a* that has been formed in advance in the insulation layer 3. An LED chip 6 is mounted on the circuit patterns 4 and 5 by using solder 7. The LED chip 6 includes a ceramic substrate 9, electrodes 10 and 11 formed thereon, and an LED die 12 as a light emitting portion disposed on the electrode 11, which is one of the electrodes. Terminals 13 and 14 are provided on the upper surface of the LED die 12. The terminal 13, which is one of the terminals, is connected to the electrode 10 via a bonding wire 15, and the terminal 14, which is the other one of the terminals, is connected to the electrode 11 via a bonding wire 16.

15 Claims, 3 Drawing Sheets

ELECTRONIC COMPONENT, ILLUMINATING DEVICE, CONTACT-TYPE IMAGE SENSOR, AND IMAGE READING DEVICE HAVING NO SHORT CIRCUIT CONDITION ACHIEVED BY ALLOWING ONLY ONE ELECTRODE OF AN LED CHIP IN DIRECT CONTACT WITH A METALLIC SUBSTRATE

BACKGROUND OF THE INVENTION

1. Field of the Invention

The present invention relates to an electronic component, an illuminating device in which the electronic component is incorporated as a light emitting unit, and a contact-type image sensor or an image reading device in which the illuminating device is incorporated.

2. Description of the Related Art

Any image reading device, such as a facsimile, a copier, and an image scanner, includes a line illuminating device that linearly illuminates the surface of a source document across a main scanning range. The line illuminating device is configured in such a way that a light emitting unit is disposed on at least one end (one end or both ends) of a rod-shaped or plate-shaped transparent light guiding member and the light incident on the end of the light guiding member exits through an exit surface provided along the longitudinal direction while being repeatedly reflected off inner surfaces of the light guiding member.

In recent years, there has been a need to increase the speed at which an image is read. To this end, it is necessary to increase the luminance of the illuminating device and increase the luminance of the illumination light that illuminates the surface of a source document to be read accordingly. However, when the current conducting through light emitting elements is increased in order to increase the luminance of the illuminating device, the resultant enhanced light emission is accompanied by increase in junction temperature (the light emitting elements themselves generate heat).

In general, the light conversion efficiency of a light emitting unit mounted on an illuminating device depends on the temperature of the atmosphere to which light emitters are exposed. The efficiency lowers as the temperature of the atmosphere rises, and the resistance of the light emitting unit lowers with the temperature. The magnitude of the current thus increases when constant-voltage driving is employed. To avoid such a situation, constant-current driving is typically employed to stabilize the luminance. In consideration of the Arrhenius scaling law (when the temperature decreases by 10 degrees, the lifetime doubles), it is known that lowering the temperature of the light emitting unit extends the lifetime thereof.

In particular, to read an image at a higher speed than that typically used in an image reading device, it is conceivable to increase the magnitude of the current flowing through an LED chip to increase the brightness of the illuminating device. Since an LED chip is a semiconductor device, nonradiative recombination more likely occurs at higher temperatures, which lowers the light emission efficiency. It is therefore necessary to appropriately dissipate heat generated in the LED chip into the atmosphere and prevent the temperature of the LED chip from excessively increasing.

To dissipate heat, Japanese Patent Laid-Open No. 2005-217644 proposes a structure in which a plate-shaped common electrode has an extension that serves as a heat dissipater. When the area of the heat dissipater is increased particularly to enhance the heat dissipation efficiency, the larger heat dissipater may interfere with other components. To address the problem, Japanese Patent Laid-Open No. 2005-217644 discloses a configuration in which the heat dissipater is folded along a case in which a transparent light guiding member is housed.

The structure of a light emitting unit of related art, including the light emitting unit described in Japanese Patent Laid-Open No. 2005-217644, includes a metallic substrate 100, an insulating layer 101 formed on the surface thereof, a circuit pattern 102 formed on the insulating layer 101, a solder resist 103 applied onto the portion other than the circuit pattern 102, and an LED chip 104 attached to the circuit pattern 102 by using solder 105, as shown in FIG. 5.

To dissipate the heat generated in the LED chip 104 through a heat dissipating plate in the structure of related art, the heat is conducted to the heat dissipating plate through the substrate 100. The insulating layer 101 is, however, interposed between the substrate 100 and the LED chip 104. The heat conductivity of the insulating layer 101 is approximately 3 W/m×K, which is at least 10 times lower than the heat conductivity of terminals (Cu) (approximately 389 W/m×K). An adequate heat dissipation effect cannot therefore be expected by the heat dissipating structure of related art.

SUMMARY OF THE INVENTION

To solve the above problem, an electronic component according to the present invention includes a metallic substrate, an insulating layer formed on the surface of the metallic substrate, a circuit formed on the insulating layer, and an element mounted on the circuit. Part of the insulating layer has an opening through which the substrate is exposed, and part of the circuit is in direct contact with the metallic substrate through the opening under the condition that no short circuit occurs.

It is conceivable to form a light emitting unit as the electronic component described above in such a way that the element is an LED chip and the condition that no short circuit occurs is achieved by allowing only one electrode of the LED chip to be in direct contact with the metallic substrate.

The position where the opening is formed is preferably immediately under the portion where the electrode of the LED chip is in contact with the circuit. Forming the opening in the position described above allows the opening to be close to a heat generating portion and hence the heat dissipation effect to be enhanced.

An LED die that forms the LED chip is preferably disposed on the electrode in contact with the circuit. Since the LED die is a heat generator, allowing the electrode with which the heat generator is in direct contact to be in contact with the circuit enhances the heat dissipation effect.

The area of the opening is preferably greater than that of the electrode of the LED chip that is in contact with the circuit. A larger area on which the electrode of the LED chip is disposed allows more efficient heat dissipation, and making the area of the opening larger than the area through which the heat is conducted allows smooth heat transfer.

The present invention encompasses an illuminating device in which the light emitting unit described above is provided at an end of a light guiding member, an image sensor and an image reading device in which the illuminating device is incorporated.

According to the present invention, the heat generated in the LED chip and other elements can be directly conducted to the metallic substrate. The heat dissipation effect is therefore enhanced without a heat dissipating block or a heat dissipating plate. Further, when a heat dissipating block or a heat dissipating plate is provided, the efficiency of conducting heat thereto is enhanced, whereby the cooling effect can be further enhanced.

DETAILED DESCRIPTION OF THE PREFERRED EMBODIMENTS

Figure 1:
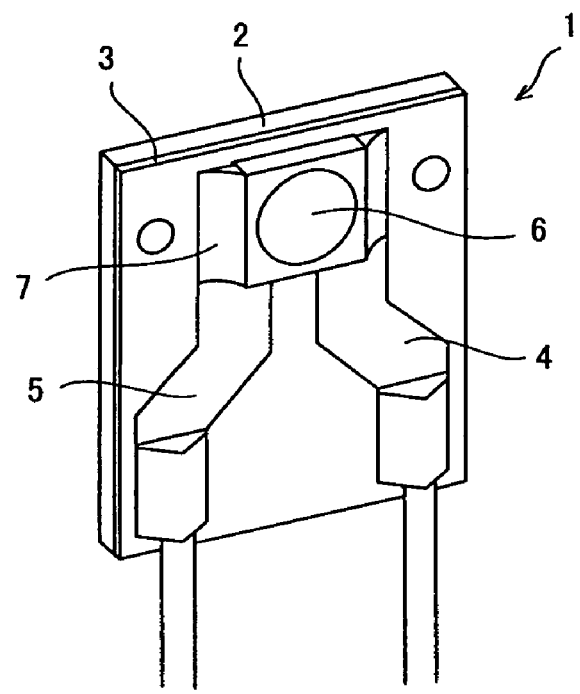
FIG. 1 is a perspective view of a light emitting unit as an electronic component according to the present invention.
Figure 2:
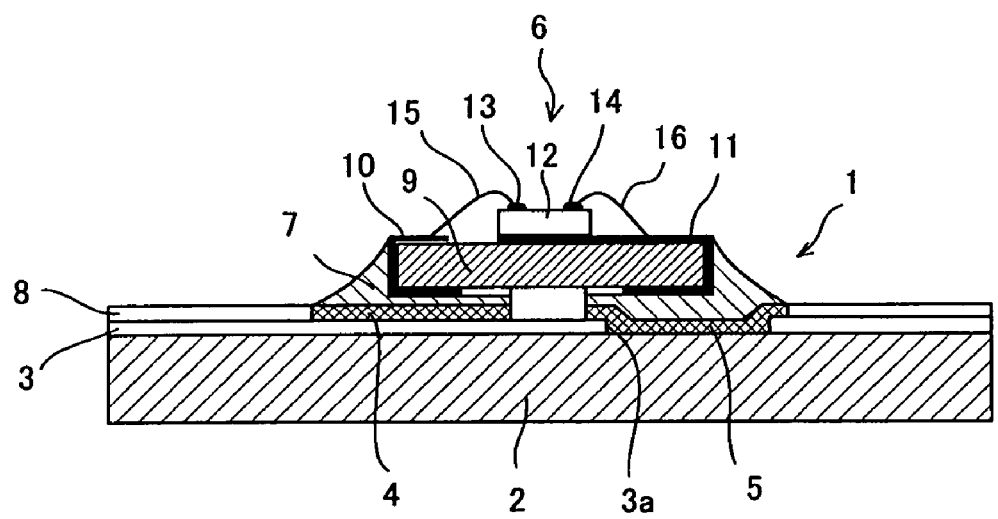
FIG. 2 is a cross-sectional view of the light emitting unit according to the present invention.
Figure 3:
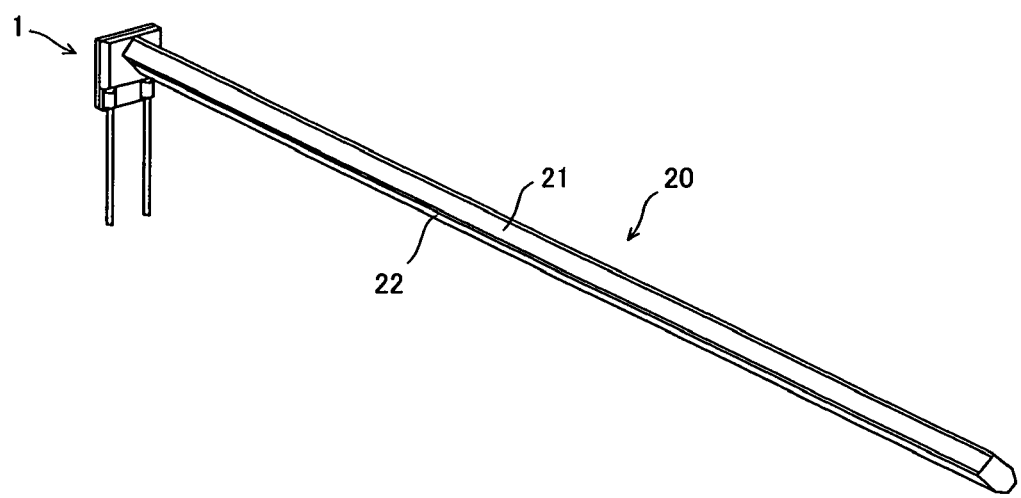
FIG. 3 is a perspective view of an illuminating device to which the light emitting unit according to the present invention is attached.
Figure 4:
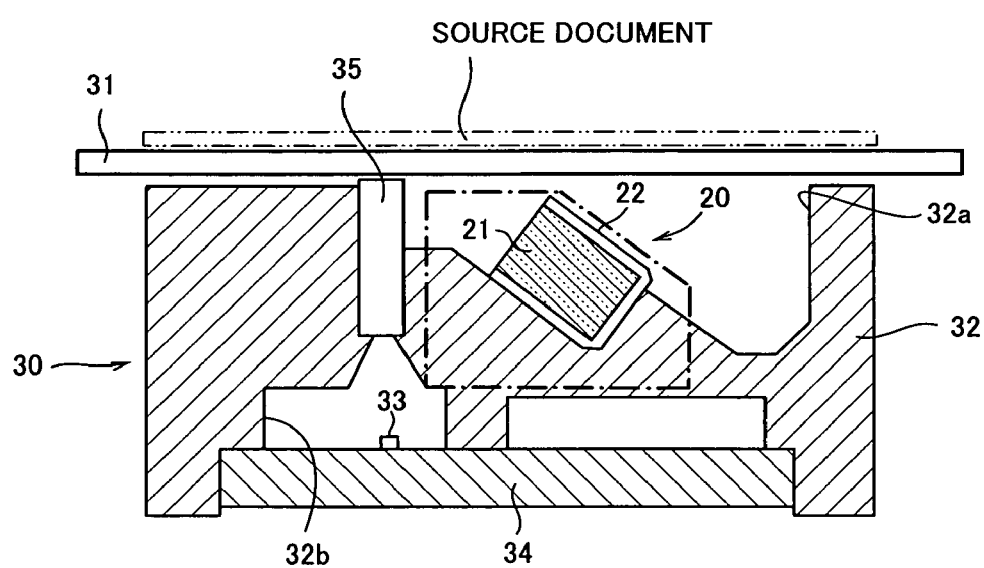
FIG. 4 is a cross-sectional view of a contact-type image sensor in which the illuminating device according to the present invention is incorporated.
Figure 5:
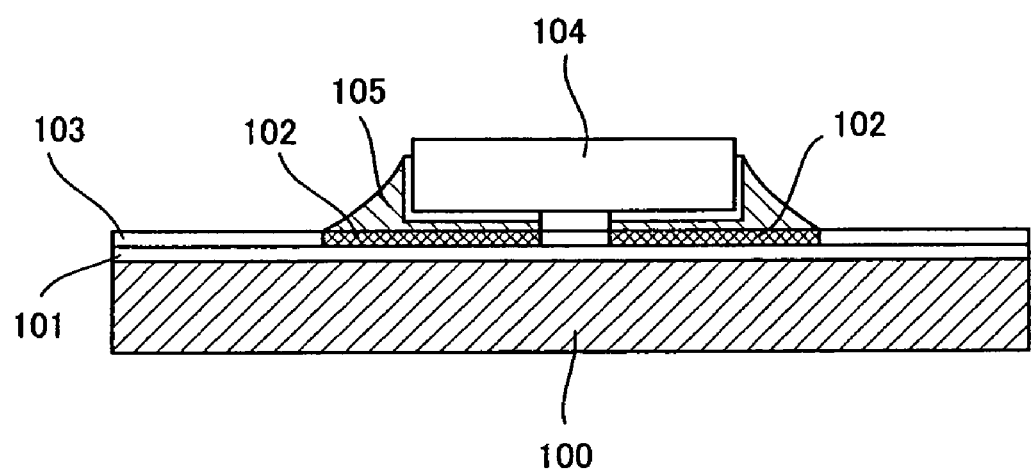
FIG. 5 is a cross-sectional view of a light emitting unit of related art.

A preferred embodiment of the present invention will be described below with reference to the accompanying drawings. FIG. 1 is a perspective view of a light emitting unit as an electronic component according to the present invention. FIG. 2 is a cross-sectional view of the light emitting unit according to the present invention. FIG. 3 is a perspective view of an illuminating device to which the light emitting unit according to the present invention is attached. FIG. 4 is a cross-sectional view of a contact-type image sensor in which the illuminating device according to the present invention is incorporated.

The light emitting unit 1 includes a substrate 2 made of copper or aluminum, an insulating layer 3 formed on the surface thereof, and circuit patterns 4 and 5 formed on the insulating layer 3. An LED chip 6 is mounted on the circuit patterns 4 and 5 by using solder 7. The portion other than terminals 4 and 5 is covered with a solder resist 8 so that the solder 7 does not attach to the portion other than the terminals 4 and 5.

The LED chip 6 includes a ceramic substrate 9, electrodes 10 and 11 formed thereon, and an LED die 12 as a light emitting portion disposed on the electrode 11, which is one of the electrodes. Terminals 13 and 14 are provided on the upper surface of the LED die 12. The terminal 13, which is one of the terminals, is connected to the electrode 10 via a bonding wire 15, and the terminal 14, which is the other one of the terminals, is connected to the electrode 11 via a bonding wire 16.

The circuit pattern 5, which is one of the circuit patterns 4 and 5, is directly formed on the substrate 2 through an opening 3a that has been formed in advance in the insulating layer 3. The circuit pattern 5 is connected to the electrode 11, on which the LED die 12 is disposed, via the solder 7. Since the circuit pattern 5 is directly in contact with the substrate 2 and connected to the electrode 11, the heat generated in the LED die 12 is efficiently conducted to the substrate 2. Only one of the electrodes 10 and 11 is connected to the circuit pattern 5, because connecting both the electrodes 10 and 11 to the circuit pattern 5 causes a short circuit.

Forming the opening 3a in a position immediately under the electrode 11, that is, in a position where the opening 3a overlaps with the electrode 11 when viewed from above allows the distance between the LED die 12, where heat is generated, and the opening 3a to be shortened and the heat dissipation effect to be enhanced.

FIG. 3 is a perspective view of an illuminating device 20 to which the light emitting unit 1 is attached. The illuminating device 20 is configured in such a way that a rod-shaped or plate-shaped transparent light guiding member 21 made of an acrylic resin is placed in a white case 22 and the light emitting unit 1 is attached to an end of the case 22. While the light emitting unit 1 is attached to an end of the case 22 in the illustrated example, the light emitting unit 1 may be attached to both ends of the case 22.

FIG. 4 is a cross-sectional view of a contact-type image sensor 30 in which the illuminating device 20 described above is incorporated. The contact-type image sensor 30 moves in the direction parallel to a glass platen 31 on which a source document is placed and reads the source document. The direction in which the contact-type image sensor 30 moves is a sub scanning direction, and the direction perpendicular to the image sensor moving direction (the longitudinal direction of the contact-type image sensor 30) is a main scanning direction.

The contact-type image sensor 30 includes a housing frame (enclosure) 32 in which recesses 32a and 32b are formed. The illuminating device 20 is disposed in the recess 32a, which is one of the recesses, and a sensor substrate 34 with a photoelectric conversion element (line image sensor) 33 is attached to the recess 32b, which is the other one of the recesses. The housing frame 32 further holds a one-to-one magnification imaging lens array 35.

While the above embodiment has been described with reference to the contact-type image sensor, the illuminating device of the present invention can also be used in a reduction-type image sensor.

What is claimed is:

1. An electronic component comprising:
   a metallic substrate;
   an insulating layer formed on the surface of the metallic substrate;
   a circuit formed on the insulating layer; and
   an element mounted on the circuit,
   wherein part of the insulating layer has an opening through which the substrate is exposed, and
   part of the circuit is in direct contact with the metallic substrate through the opening under the condition that no short circuit occurs, wherein the element is an LED chip, and the condition that no short circuit occurs is achieved by allowing only one electrode of the LED chip to be in contact with the metallic substrate via the circuit.

2. The electronic component according to claim 1, wherein the opening is formed immediately under the portion where the electrode of the LED chip is in contact with the circuit.

3. The electronic component according to claim 2, wherein an LED die that forms the LED chip is disposed on the electrode in contact with the circuit.

4. The electronic component according to claim 1, wherein the area of the opening is greater than that of the electrode of the LED chip that is in contact with the circuit.

5. An illuminating device comprising the electronic component according to claim 1 as a light emitting unit, wherein the electronic component is attached to an end of a light guiding member.

6. A contact-type image sensor comprising:
   the illuminating device according to claim 5;
   an image sensor; and
   a lens array incorporated in a frame, the lens array focusing the light reflected off or transmitted through a source document on the image sensor.

7. An image reading device comprising the contact-type image sensor according to claim 6.

8. A reduction-type optical image reading device comprising:
- the illuminating device according to claim 5;
- an image sensor; and
- a mirror and a lens incorporated in a frame, the mirror and the lens focusing the light reflected off or transmitted through a source document on the image sensor.

9. The electronic component according to claim 2, wherein the area of the opening is greater than that of the electrode of the LED chip that is in contact with the circuit.

10. The electronic component according to claim 3, wherein the area of the opening is greater than that of the electrode of the LED chip that is in contact with the circuit.

11. An illuminating device comprising the electronic component according to claim 2 as a light emitting unit, wherein the electronic component is attached to an end of a light guiding member.

12. An illuminating device comprising the electronic component according to claim 3 as a light emitting unit, wherein the electronic component is attached to an end of a light guiding member.

13. An illuminating device comprising the electronic component according to claim 4 as a light emitting unit, wherein the electronic component is attached to an end of a light guiding member.

14. An illuminating device comprising the electronic component according to claim 9 as a light emitting unit, wherein the electronic component is attached to an end of a light guiding member.

15. An illuminating device comprising the electronic component according to claim 10 as a light emitting unit, wherein the electronic component is attached to an end of a light guiding member.

* * * * *